United States Patent
Liao et al.

(10) Patent No.: US 9,791,773 B2
(45) Date of Patent: Oct. 17, 2017

(54) PHOTOSENSITIVE RESIN COMPOSITION, COLOR FILTER AND LIQUID CRYSTAL DISPLAY DEVICE

(71) Applicant: CHI MEI CORPORATION, Tainan (TW)

(72) Inventors: Hao-Wei Liao, Kaohsiung (TW); I-Chun Hsieh, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 694 days.

(21) Appl. No.: 14/108,311

(22) Filed: Dec. 16, 2013

(65) Prior Publication Data
US 2014/0175347 A1 Jun. 26, 2014

(30) Foreign Application Priority Data
Dec. 20, 2012 (TW) .............................. 101148672 A

(51) Int. Cl.
*G03F 7/00* (2006.01)
*G03F 7/023* (2006.01)
*G03F 7/031* (2006.01)
*G03F 7/038* (2006.01)
*G03F 7/105* (2006.01)

(52) U.S. Cl.
CPC .......... *G03F 7/0007* (2013.01); *G03F 7/0233* (2013.01); *G03F 7/031* (2013.01); *G03F 7/0388* (2013.01); *G03F 7/105* (2013.01)

(58) Field of Classification Search
USPC ............................. 252/586; 430/280.1, 281.1
See application file for complete search history.

(56) References Cited

U.S. PATENT DOCUMENTS

| | | | | | |
|---|---|---|---|---|---|
| 4,889,789 | A | * | 12/1989 | Stahlhofen | ............ G03F 7/0045 430/165 |
| 2008/0220372 | A1 | * | 9/2008 | Lee | ........................ G03F 7/0007 430/281.1 |

FOREIGN PATENT DOCUMENTS

| | | |
|---|---|---|
| CN | 1564083 A | 1/2005 |
| CN | 1570764 A | 1/2005 |
| CN | 102015633 A | 4/2011 |
| JP | 2006-251009 A | 9/2006 |
| JP | 2006-259716 A | 9/2006 |
| JP | 2008-268854 A | 11/2008 |

* cited by examiner

*Primary Examiner* — Monique R Peets
(74) *Attorney, Agent, or Firm* — CKC & Partners Co., Ltd.

(57) ABSTRACT

The present invention relates to a photosensitive resin composition for black matrix, as well as a color filter and a liquid crystal display (LCD) device formed by the composition. The aforementioned photosensitive resin composition comprises an alkali-soluble resin (A), a compound containing vinyl unsaturated group(s) (B), a photo initiator (C), quinonediazide sulfonic acid ester (D), a solvent (E) and black pigment (F). The alkali-soluble resin (A) includes epoxy resin having unsaturated group(s) (A-1), which is obtained by reacting an epoxy resin (i) having at least two epoxy groups with a compound (ii) having at least one vinyl unsaturated group and carboxyl group. The aforementioned photo initiator (C) includes an O-acyloxime compound (C-1).

16 Claims, No Drawings

PHOTOSENSITIVE RESIN COMPOSITION, COLOR FILTER AND LIQUID CRYSTAL DISPLAY DEVICE

RELATED APPLICATIONS

This application claims priority to Taiwan Application Serial Number 101148672, filed Dec. 20, 2012, which is herein incorporated by reference.

BACKGROUND

Field of Invention

The present invention relates to a photosensitive resin composition for black matrix (BM) and a color filter and a liquid crystal display (LCD) device using the same. More particularly, the present invention relates to a photosensitive resin composition for BM which has excellent adhesiveness and residue-free after being developed and a color filter and a LCD device using the same.

Description of Related Art

For the purpose of enhancing the contrast and display quality of a liquid crystal display (LCD), black matrix (BM) is generally disposed in stripe-like and dot-like gaps of a color filter, so that light leakage between pixels is prevented, and the defects of worse contrast and color purity caused by the light leakage are overcome. Most of BM is a vapor deposited film that is made by chromium or chromium oxide conventionally however, there are some problems such as complicated processes and expensive materials existed in the conventional BM. In order to dissolve the problems, the photosensitive resin is formed to BM by using photolithography.

Since the industry field currently requires higher light shielding property of BM, a solution of improvement of the light shielding property of BM is to increase a usage of a black pigment. For example, a photosensitive resin composition for BM disclosed in the Japanese Patent Laid-open publication No. 2006-259716 includes a black pigment with a high content, an alkaline-soluble resin, photopolymerization initiator, a reactive monomer with two functional groups and an organic solvent. The reactive monomer with two functional groups can improve the reaction among those compounds for forming highly fine patterns. Therefore, in such photosensitive resin composition, the sensibility of the photosensitive resin composition can be still maintained when the content of BM is increased for enhancing the light-shielding property.

Moreover, a photosensitive resin composition for BM disclosed in the Japanese Patent Laid-open publication No. 2008-266854 includes an alkaline-soluble resin with a carboxylic acid group and a polymerizable unsaturated group, a photopolymerization monomer with a vinyl unsaturated group, a photopolymerization initiator and a black pigment with a high content. In the aforementioned photosensitive resin composition for BM, the specific alkaline-soluble resin improves the resolution of the photosensitive resin composition for BM that contains a high content of the black pigment.

Although the photosensitive resin composition for BM with increased content of the black pigment can meet the requirement of the industry field, those conventional photosensitive resin compositions are exposed, developed and formed to patterns, the patterns are easily peeled off, causing the problems of poor adhesiveness and residues of unexposed portion after being developed.

Accordingly, it is desired to provide a photosensitive resin composition for BM which has excellent adhesiveness and residue-free after being developed so as to overcome the aforementioned problems of the prior photosensitive resin composition, for example, poor adhesiveness after being developed, residues of unexposed portion after being developed and so on.

SUMMARY

Therefore, an aspect of the present invention provides a photosensitive resin composition, which includes an alkali-soluble resin (A), a compound (B) containing vinyl unsaturated group(s), a photo initiator (C), quinonediazide sulfonic acid ester (D), a solvent (E) and black pigment (F). The alkali-soluble resin (A) includes epoxy resin having unsaturated group(s) (A-1), which is obtained by reacting an epoxy resin (i) having at least two epoxy groups with a compound (ii) having at least one vinyl unsaturated group and carboxyl group. The aforementioned photo initiator (C) includes an O-acyloxime compound (C-1). The aforementioned photosensitive resin composition can be applied to make black matrix (BM) that has excellent adhesiveness and residue-free after being developed.

Another aspect of the present invention provides a black matrix, which is made by the aforementioned photosensitive resin composition.

Still another aspect of the present invention provides a color filter, which includes the aforementioned black matrix.

Yet still another aspect of the present invention provides a liquid crystal display (LCD) device, which includes the aforementioned color filter, thereby improving the problems of the prior photosensitive resin composition, for example, poor adhesiveness after developed, residues of unexposed portion after being developed and so on.

Photosensitive Resin Composition

Before proceeding further, it is appropriate to refer that the invention provides a photosensitive resin composition, which comprises an alkali-soluble resin (A), a compound containing vinyl unsaturated group(s) (B), a photo initiator (C), a quinonediazide sulfonic acid ester (D), a solvent (E) and black pigment (F), which are respectively described below.

It should be supplemented that, (methyl)acrylic acid refers to acrylic acid and/or methacrylic acid, (methyl)acrylate ester refers to acrylate ester and/or methacrylate ester, and similarly, (methyl)acryloyl group refers to acryloyl group and/or methacryloyl group.

Alkali-Soluble Resin (A)

The alkali-soluble resin (A) of the present invention includes a resin having unsaturated group(s) (A-1), and the resin having unsaturated group(s) (A-1) is obtained by subjecting a mixture to a polymerization. The mixture includes an epoxy compound having at least two epoxy groups (i) with a compound having at least one vinyl unsaturated group and carboxyl group (ii). In addition, the mixture further optionally includes a carboxylic acid anhydride compound (iii) and/or a compound containing epoxy group(s) (iv).

(1) Resin Having Unsaturated Group(s) (A-1)

(1.1) Epoxy Compound Having at Least Two Epoxy Groups (i)

The aforementioned epoxy compound having at least two epoxy groups (i) comprises a structure of Formula (I):

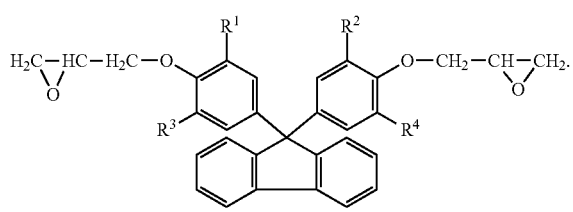

In the Formula (I), $R^1$, $R^2$, $R^3$ and $R^4$ are the same or different from each other, each of which independently represent a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms.

The aforementioned epoxy compound having at least two epoxy groups (i) listed in Formula (I) can include but be not limited to bisphenol fluorine compound containing epoxy group(s) that is obtained by reacting bisphenol fluorine compound with epihalohydrin.

In detail, examples of the aforementioned bisphenol fluorine compound can include but be not limited to 9,9-bis(4-hydroxyphenyl) fluorine, 9,9-bis (4-hydroxy-3-methylphenyl) fluorine, 9,9-bis(4-hydroxy-3-chlorophenyl) fluorine, 9,9-bis(4-hydroxy-3-bromophenyl) fluorine, 9,9-bis(4-hydroxy-3-fluorophenyl) fluorine, 9,9-bis(4-hydroxy-3-methoxyphenyl) fluorine, 9,9-bis (4-hydroxy-3,5-dimethylphenyl) fluorine, 9,9-bis(4-hydroxy-3,5-dichlorophenyl) fluorine, 9,9-bis(4-hydroxy-3,5-dibromophenyl)fluorine and so on.

Suitable examples of the aforementioned epihalohydrin can include but be not limited to 3-chloro-1,2-epoxypropane (epichlorohydrin), 3-bromo-1,2-epoxypropane (epibromohydrin) and so on.

The resulted bisphenol fluorine compound containing epoxy group(s) may include but be not limited to the commercially available products such as: (1) ESF-300 manufactured by NIPPON STEEL CHEMICAL Co., Ltd.; (2) PG-100, EG-210 and the like manufactured by OSAKA GAS Co., Ltd.; (3) SMS-F9PhPG, SMS-F9CrG, SMS-F914PG and the like manufactured by S.M.S Technology Co.

Moreover, the aforementioned epoxy compound having at least two epoxy groups (i) further comprises a structure of Formula (II):

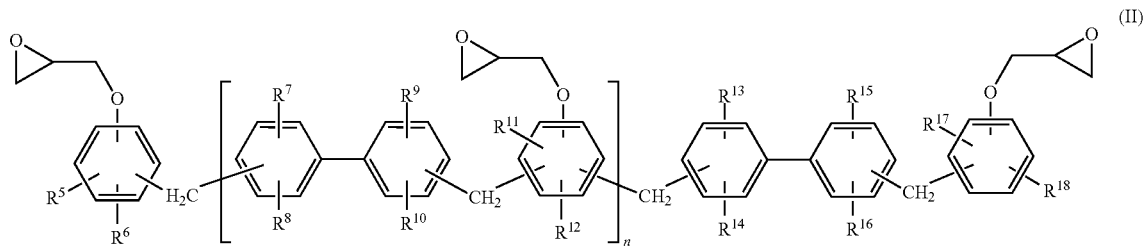

In the Formula (II), $R^5$ to $R^{18}$ are the same or different from each other, each of which independently represents a hydrogen atom, a halogen atom, an alkyl group with one to eight carbon atoms or an aromatic hydrocarbon group with six to fifteen carbon atoms, and n represents an integer of zero to ten.

The aforementioned epoxy compound having at least two epoxy groups (i) listed in Formula (II) can be obtained by reacting a compound listed in Formula (II-1) with halogenated epoxypropane:

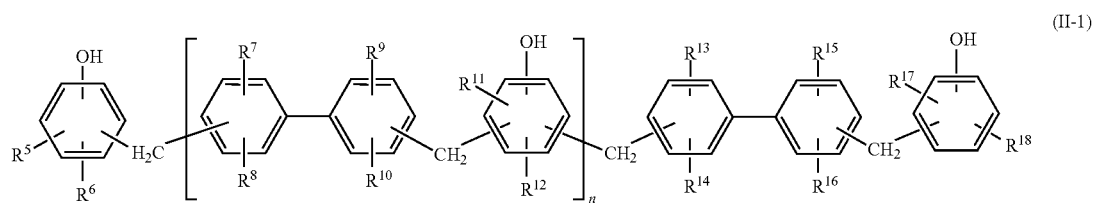

In the Formula (II-1), $R^5$ to $R^{18}$ and n have the same definitions with the ones of Formula (II) respectively rather than being reciting them in detail.

Furthermore, the aforementioned epoxy compound having at least two epoxy groups (i) listed in Formula (II) is condensed with a compound listed in Formula (II-2) and phenol in the presence of an acid catalyst, thereby forming the compound listed in Formula (II-1). Next, a dehydrohalogenation is carried out by adding excess of halogenated epoxypropane into the above reaction solution, so as to obtain the epoxy compound having at least two epoxy groups (i) listed in Formula (II).

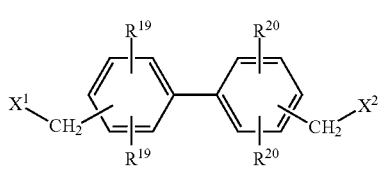

(II-2)

In the Formula (II-2). $R^{19}$ and $R^{20}$ are the same or different from each other, each of which independently represent a hydrogen atom, a halogen atom, an alkyl group with one to eight carbon atoms or an aromatic hydrocarbon group with six to fifteen carbon atoms; $X^1$ and $X^2$ independently represent a halogen atom, an alkyl group with one to six carbon atoms or an alkoxy group with one to six carbon atoms. Preferably, the halogen atom may be chlorine or bromine; the alkyl group may be methyl, ethyl or tert-butyl group; the alkoxy group may be methoxy or ethoxy group.

Appropriate examples of the aforementioned phenols may include but be not limited to: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol and the like. Typically, the aforementioned phenols may be used alone or in combinations of two or more.

Based on an amount of the compound listed in Formula (II-2) as 1 mole, an amount of the phenols is typically 0.5 to 20 moles, preferably 2 to 15 moles.

Examples of the aforementioned acid catalyst may include but be not limited to: hydrogen chloride, sulfuric acid, p-toluenesulfonic acid, oxalic acid, boron trifluoride, aluminium chloride anhydrous, zinc chloride and the like. However, p-toluenesulfonic acid, hydrogen chloride and sulfuric acid are preferably used. Typically, the aforementioned acid catalyst may be used alone or in combinations of two or more.

In addition, there are no limitations specific to the amount of the aforementioned acid catalyst. However, in the preferable condition, based on 100 percentages by weight of the compound listed in Formula (II-2), an amount of the acid catalyst is typically 0.1 to 30 percentages by weight.

The aforementioned condensation reaction can be performed without any solvent or in the presence of an organic solvent. Examples of the aforementioned organic solvent may include but be not limited to toluene, xylene, methyl isobutyl ketone and so on. The aforementioned organic solvent may be used alone or in combinations of two or more.

Based on the total weight of the compound listed in Formula (II-2) and the phenols as 100 percentages by weight, an amount of the organic solvent is typically 50 to 300 percentages by weight, and preferably 100 to 250 percentages by weight. In addition, the aforementioned condensation reaction is operated under a temperature of 40° C. to 180° C. for a period of 1 hour to 8 hours.

After the condensation reaction is finished, a neutralization or rinse treatment can be performed. In the aforementioned neutralization treatment, pH value of the reaction solution is adjusted to pH3 to pH7, and preferably pH5 to pH7. A neutralization reagent may be used in the aforementioned rinse treatment, in which the neutralization reagent is an alkaline substance and its examples may include but be not limited to alkali metal hydroxides such as sodium hydroxide, potassium hydroxide and the like; alkaline earth metal hydroxides such as calcium hydroxide, magnesium hydroxide and the like; organic amines such as diethylene triamine, triethylenetetramine, aniline, phenylene diamine and the like; and ammonia, sodium dihydrogen phosphate and so on. Conventional methods can be used in the aforementioned rinse treatment. For example, a neutralizing reagent-containing solution is added into the reaction solution followed by repetitively extracting. After the neutralization or rinse treatment is finished, unreactive phenols and solvents in the product are evaporated and removed by using a heating treatment under decreased pressure, and then concentrated, thereby obtaining the compound listed in Formula (II-1).

Examples of the aforementioned halogenated epoxypropane (epihalohydrin) may include but be not limited to 3-chloro-1,2-epoxypropane (epichlorohydrin), 3-bromo-1,2-epoxypropane (epibromohydrin) and the combination thereof. Before proceeding the aforementioned dehydrohalogenation, alkali metal hydroxides such as sodium hydroxide, potassium hydroxide can be added before or during the reaction process. The aforementioned dehydrohalogenation is carried out under a temperature of 20° C. to 120° C. for a period of 1 hour to 10 hours.

In an embodiment, the formulation of the alkali metal hydroxide can be also used in an aqueous solution for adding into the aforementioned dehydrohalogenation reaction system. In this example, when the solution of the alkali metal hydroxides is continuously added into the dehydrohalogenation reaction system, water and halogenated epoxypropane (epihalohydrin) can be simultaneously distillated out under a normal or decreased pressure, thereby separating and removing water, as well as reflowing the epihalohydrin back into the reaction system continuously.

Before the aforementioned dehydrohalogenation is carried out, a tertiary ammonium salt such as tetramethyl ammonium chloride, tetramethyl ammonium bromide, trimethyl benzyl ammonium chloride or the like can be used as a catalyst and added into the dehydrohalogenation reaction system, followed by performing the dehydrohalogenation under a temperature of 50° C. to 150° C. for a period of 1 hour to 5 hours. Next, the alkali metal hydroxide or its solution can be then added into such reaction system under a temperature of 20° C. to 120° C. for a period of 1 hour to 10 hours for carrying out the dehydrohalogenation.

Based on the total hydroxyl equivalent amount of the compound listed in Formula (II-2) as 1 equivalent, an amount of the epihalohydrin is typically 1 to 20 equivalents, preferably 2 to 10 equivalents. Based on the total hydroxyl groups in the compound listed in Formula (II-1) as 1 equivalent, an amount of the alkali metal hydroxide added in the dehydrohalogenation is typically 0.8 to 15 equivalents, preferably 0.9 to 11 equivalents.

In addition, for the purpose of successful execution of the dehydrohalogenation, a polar aprotic solvent such as dimethyl sulfone, dimethyl sulfoxide and the like can be also added. When an alcohol is used in the reaction, based on 100 percentages by weight of the epihalohydrin, an amount of the alcohol is 2 to 20 percentages by weight, and preferably 4 to 15 percentages by weight. When the polar aprotic solvent is used in the reaction, based on 100 percentages by weight of the epihalohydrin, an amount of the polar aprotic solvent is 5 to 100 percentages by weight, and preferably 10 to 90 percentages by weight.

After the dehydrohalogenation is completed, a rinse treatment is optionally performed. Afterward, the epihalohydrin, the alcohol and the polar aprotic solvent can be removed by using a heating treatment of 110° C. to 250° C. under decreased pressure of less than 1.3 kPa (10 mmHg).

For preventing the resulted epoxy resin from remaining hydrolytic halogen therein, toluene, methyl isobutyl ketone or the like can be added into the solution that has reacted after the dehydrohalogenation, and then the solution of the alkali metal hydroxide such as sodium hydroxide, potassium hydroxide can be added to perform the dehydrohalogenation again. During the dehydrohalogenation, based on the total hydroxyl groups in the compound listed in Formula (II-1) as 1 equivalent, an amount of the alkali metal hydroxide added in the dehydrohalogenation is typically 0.01 to 0.3 moles, preferably 0.05 to 0.2 moles. In addition, the dehydrohalogenation is operated in a temperature of 50° C. to 120° C. for a period of 0.5 hour to 2 hours.

After the dehydrohalogenation is finished, salts can be removed by using processes of filtration, rinse and so on. In addition, toluene, methyl isobutyl ketone or the like can be distilled out and removed, thereby obtaining an epoxy compound having at least two epoxy groups (i). The epoxy compound having at least two epoxy groups (i) the commercially available products such as NC-3000, NC-3000H, NC-3000S, NC-3000P and the like manufactured by NIPPON KAYAKU Co., Ltd.

(1.2) Compound Having at Least One Vinyl Unsaturated Group and Carboxyl Group (ii)

The aforementioned compound having at least one vinyl unsaturated group and carboxyl group (ii) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl cis-hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl hydrophthalic acid, 2-methacryloyloxybutyl hexahydrophthalic acid or 2-methacryloyloxybutyl hydrophthalic acid; (2) a compound obtained by reacting (methyl)acrylate ester having hydroxyl group(s) with a dicarboxylic acid compound, in which the dicarboxylic acid compound may include but be not limited to hexanedioic acid, butanedioic acid, maleic acid and phthalic acid; (3) a compound obtained by reacting (methyl)acrylate ester having hydroxyl group(s) with a carboxylic acid anhydride compound (iii), in which the (methyl)acrylate ester having hydroxyl group(s) may include but be not limited to (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, pentaerythritol triacrylate and so on. In addition, the carboxylic acid anhydride compound described herein is the same with the carboxylic acid anhydride compound (iii) in the aforementioned mixture of the resin having unsaturated group(s) (A-1) rather than being recited herein.

As aforementioned, the mixture of the resin having unsaturated group(s) (A-1) can optionally include the carboxylic acid anhydride compound (iii) and/or the compound containing epoxy group(s) (iv). The carboxylic acid anhydride compound (iii) can be selected from the group consisting of the following subgroups (1) to (2): (1) a dicarboxylic acid anhydride compound such as butanedioic anhydride, maleic anhydride, itaconic anhydride, phthalic anhydride, tetrahydrophthalic anhydride, hexahydrophthalic anhydride, methyltetrahydrophthalic anhydride, methylhexahydrophthalic anhydride, methyl endo-methylene tetrahydrophthalic anhydride, chlorendic anhydride, 1,3-dioxoisobenzofuran-5-carboxylic anhydride and the like; and (2) a tetracarboxylic acid anhydride compound such as benzophenone tetracarboxylic dianhydride (BTDA), diphthalic dianhydride, diphenyl ether tetracarboxylic acid dianhydride and the like.

The aforementioned compound containing epoxy group(s) (iv) is selected from the group consisting of glycidyl methacrylate, 3,4-epoxycyclohexyl methacrylate, glycidyl ether compound having unsaturated group(s), unsaturated compound having epoxy group(s) or any combination thereof. The glycidyl ether compound having unsaturated group(s) may include but be not limited to the commercially available products such as Denacol EX-111, Denacol EX-121, Denacol EX-141, Denacol EX-145, Denacol EX-146, Denacol EX-171, Denacol EX-192 and so on manufactured by Nagase ChemteX Corporation.

The aforementioned resin having unsaturated group(s) (A-1) can be synthesized as follows. The epoxy compound having at least two epoxy groups (i) and the compound having at least one vinyl unsaturated group and carboxyl group (ii) are polymerized and formed to an intermediate product having hydroxyl group(s), and then the intermediate product reacts with the carboxylic acid anhydride compound (iii), so as to obtain the resin having unsaturated group(s) (A-1). Preferably, based on the total hydroxyl equivalent amount of the intermediate product having hydroxyl group(s) as 1 equivalent, the total anhydride equivalent amount of the carboxylic acid anhydride compound (iii) is 0.4 to 1 equivalent, and preferably 0.75 to 1 equivalent. When a plurality of the carboxylic acid anhydride compound (iii) are used in this reaction, they can be added sequentially or simultaneously in the reaction. Preferably, when dicarboxylic acid anhydride compound and tetracarboxylic acid anhydride compound are employed as the carboxylic acid anhydride compound (iii), the molar ratio of dicarboxylic acid anhydride compound to the tetracarboxylic acid anhydride compound may be 1/99 to 90/10, and preferably 5/95 to 80/20. In addition, this reaction can be operated under a temperature of 50° C. to 130° C.

The aforementioned resin having unsaturated group(s) (A-1) can be synthesized as follows. The epoxy compound having at least two epoxy groups (i) and the compound having at least one vinyl unsaturated group and carboxyl group (ii) both listed in Formula (I) react with each other to form an intermediate product having hydroxyl group(s). And then, the intermediate product reacts with the carboxylic acid anhydride compound (iii) and/or a compound containing epoxy group(s) (iv), so as to obtain the resin having unsaturated group(s) (A-1). Preferably, based on the total epoxy equivalent amount of the epoxy compound having at least two epoxy groups (i) listed in Formula (II) as 1 equivalent, the total acid equivalent amount of the compound having at least one vinyl unsaturated group and carboxyl group (ii) is 0.8 to 1.5 equivalent, and preferably 0.9 to 1.1 equivalent. Based on the total hydroxyl equivalent amount of the intermediate product having hydroxyl group(s) as 100 percentage by mole (mole %), an amount of the carboxylic acid anhydride compound (iii) is 10 to 100 mole %, preferably 20 to 100 mole %, and more preferably 30 to 100 mole %.

During the preparation of the resin having unsaturated group(s) (A-1), the reaction solution is usually added with an alkaline compound as a reaction catalyst for accelerating the reaction. The reaction catalyst may be used alone or in combinations of two or more, and the reaction may include but be not limited to triphenyl phosphine, triphenyl stibine, triethylamine, triethanolamine, tetramethylammonium chloride, benzyltriethylammonium chloride and the like. Preferably, based on a total weight of the epoxy compound having at least two epoxy groups (i) and the compound having at least one vinyl unsaturated group and carboxyl group (ii) as 100 parts by weight, an amount of the reaction catalyst is 0.01 to 10 parts by weight, and preferably 0.3 to 5 parts by weight.

In addition, for the purpose of controlling the polymerization degree, a polymerization inhibitor is usually added into the reaction solution. The aforementioned polymerization inhibitor may include but be not limited to methoxyphenol, methylhydroquinone, hydroquinone, 2,6-di-t-butyl-p-cresol, phenothiazine and the like. Typically, the polymerization inhibitor may be used alone or in combinations of two or more. Based on the total weight of the epoxy compound having at least two epoxy groups (i) and the compound having at least one vinyl unsaturated group and carboxyl group (ii) as 100 parts by weight, an amount of the polymerization inhibitor is 0.01 to 10 parts by weight, and preferably 0.1 to 5 parts by weight.

During the preparation of the resin having unsaturated group(s) (A-1), a polymerization solvent can be use if necessary. Examples of the polymerization solvent may include but be not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol) alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent may be used alone or in combinations of two or more. An acid equivalent of the resin having unsaturated group(s) (A-1) is 50 mg KOH/g to 200 mg KOH/g, and preferably 60 mg KOH/g to 150 mg KOH/g.

Based on the amount of the alkali-soluble resin (A) as 100 parts by weight, the amount of the resin having unsaturated group(s) (A-1) is 30 to 100 parts by weight, preferably 50 to 100 parts by weight, and more preferably 70 to 100 parts by weight. When the photosensitive resin composition has no the resin having unsaturated group(s) (A-1), the resulted photosensitive resin composition would have disadvantages such as poor adhesiveness after being developed and poor thermal resistance after being postbaked.

(2) Other Alkali-Soluble Resin (A-2)

The alkali-soluble resin (A) described herein may further include other alkali-soluble resin (A-2). The other alkali-soluble resin (A-2) can include but be not limited to a resin containing carboxyl or hydroxyl groups, for example, acrylic resin except from the resin having unsaturated group(s) (A-1), urethane resin, novolac resin and the like.

Based on the total amount of the alkali-soluble resin (A) as 100 parts by weight, the amount of the other alkali-soluble resin (A-2) is 0 to 70 parts by weight, preferably 0 to 50 parts by weight, and more preferably 0 to 30 parts by weight.

Compound Containing Vinyl Unsaturated Group(s) (B)

The compound containing vinyl unsaturated group(s) (B) described herein can include but be not limited to a compound having at least one vinyl unsaturated group (B-1) or a compound having at least two vinyl unsaturated groups (B-2) (including two vinyl unsaturated groups).

The compound having at least one vinyl unsaturated group (B-1) can include but be not limited to (meth)acrylamide, (meth)acryloyl morpholine, 7-amine-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth)acrylate, t-octyl (meth)acrylamide, diacetone (meth)acrylamide, dimethylaminoethyl (meth)acrylamide, dodecyl (meth)acrylamide, dicyclopentenyloxyethyl (meth)acrylate, dicyclopentadiene (meth)acrylate, N,N-dimethyl(meth) acrylamide, tetrachlorophenyl (meth)acrylate, 2-tetrachlorophenoxyethyl (meth)acrylate, tetrahydrofurfuryl (meth) acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidone, phenoxyethyl (meth)acrylate, pentachlorophenyl (meth)acrylate, pentachlorophenyl (meth)acrylate, polyethylene glycol mono(meth)acrylate, polypropylene glycol mono(meth)acrylate, bornyl (meth) acrylate and the like. The above-mentioned compound having at least one vinyl unsaturated group (B-1) can be used alone or in combinations of two or more.

The compound having at least two vinyl unsaturated groups (B-2) (including two vinyl unsaturated groups) can include but be not limited to ethylene glycol di(meth) acrylate, dicyclopentenyl (meth)acrylate, triethylene glycol di(meth)acrylate, tetraethylene glycol di(meth)acrylate, tris (2-hydroxyethyl) isocyanurate di(meth)acrylate, tris(2-hydroxyethyl) isocyanurate tri(meth)acrylate, caprolactone-modified tris(2-hydroxyethyl) isocyanurate tri(meth) acrylate, trimethylolpropyl tri(meth)acrylate, EO-modified trimethylolpropyl tri(meth)acrylate, PO-modified trimethylolpropyl tri(meth)acrylate, tripropylene glycol di(meth) acrylate, neopentyl glycol di(meth)acrylate, 1,4-butanediol di(meth)acrylate, 1,6-hexanediol di(meth)acrylate, pentaerythritol tri(meth)acrylate, pentaerythritol tetra(meth) acrylate, polyester di(meth)acrylate, polyethylene glycol di(meth)acrylate, dipentaerythritol hexa(meth)acrylate, dipentaerythritol penta(meth)acrylate, dipentaerythritol tetra (meth)acrylate, caprolactone-modified dipentaerythritol hexa(meth)acrylate, caprolactone-modified dipentaerythritol penta(meth)acrylate, di(trimethylolpropane) tetra(meth) acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, novolac polyglycidyl ether (meth)acrylate and the like. The above-mentioned compound having at least two vinyl unsaturated groups (B-2) can be used alone or in combinations of two or more.

Examples of the compound containing vinyl unsaturated group(s) (B) can include but be not limited to trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, di(trimethylolpropane) tetraacrylate, PO-modified glycerol triacrylate and any combination thereof.

Based on the total amount of the alkali-soluble resin (A) as 100 parts by weight, the amount of the compound containing vinyl unsaturated group(s) (B) is 20 to 180 parts by weight, preferably 30 to 170 parts by weight, and more preferably 40 to 160 parts by weight, so that the photosensitive resin composition can exhibit excellent development property.

Photoinitiator (C)

The photoinitiator (C) of the present invention can include but be not limited to an O-acyloxime compound (C-1), a triazine compound, a acetophenone compound, a diimidazole compound, a benzophenone compound, a α-dione (α-diketone) compound, an acyloin compound, an acyloin ether compound, an acylphosphineoxide compound, a quinone compound, a halogen-containing compound, a peroxide and so on, which are respectively described below.

Examples of the O-acyloxime compound (C-1) include: 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazole-3-yl]-ethanone 1-(O-acetyloxime), 1-[9-ethyl-6-(3-methyl benzoyl)-9H-carbazole-3-yl]-ethanone 1-(O-acetyloxime), 1-[9-ethyl-6-benzoyl-9H-carbazole-3-yl]-ethanone 1-(O-acetyloxime), ethanone-1-[9-ethyl-6-(2-methyl-4-tetrahydrofuranylbenzoyl)-9H-carbazole-3-yl]-1-(O-acetyloxime), ethanone-1-[9-ethyl-6-(2-methyl-4-tetrahydropyranylbenzoyl)-9H-carbazole-3-yl]-1-(O-acetyloxime), ethanone-1-[9-ethyl-6-(2-methyl-5-tetrahydrofuranylbenzoyl)-9H-carbazole-3-yl]-1-(O-acetyloxime), ethanone-1-[9-ethyl-6-(2-methyl-5-tetrahydropyranylbenzoyl)-9H-carbazole-3-yl]-1-(O-acetyl oxime), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-(2-methyl-4-tetrahydropyranylmethoxybenzoyl)-9H-carbazole-3-yl]-1-(O-acetyloxime), ethanone-1-[9-ethyl-6-(2-methyl-5-tetrahydrofuranylmethoxybenzoyl)-9H-carbazole-3-yl]-1-(O-acetyloxime), ethanone-1-[9-ethyl-6-(2-methyl-5-tetrahydropyranyl methoxybenzoyl)-9H-carbazole-3-yl]-1-(O-acetyloxime), ethanone-1-[9-ethyl-6-{2-methyl-4-(2,2-dimethyl-1,3-dioxolanyl)benzoyl}-9-H-carbazole-3-yl]-1-(O-acetyloxime), ethanone-1-[9-ethyl-6-{2-methyl-4-(2,2-dimethyl-1,3-dioxolanyl) methoxybenzoyl}-9H-carbazole-3-yl]-1-(O-acetyloxime) and the like.

Among those O-acyloxime compounds (C-1), 1-[4-(phenylthio)phenyl]-octane-1,2-dione 2-(O-benzoyloxime) (for example, the trade name OXE01 manufactured by CIBA SPECIALTY CHEMICALS Corporation), 1-[9-ethyl-6-(2-methylbenzoyl)-9H-carbazole-3-yl]-ethanone 1-(O-acetyloxime) (for example, the trade name OXE02 manufactured by CIBA SPECIALTY CHEMICALS Co.), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-{2-methyl-4-(2,2-dimethyl-1,3-dioxolanyl) methoxybenzoyl}-9H-carbazole-3-yl]-1-(O-acetyloxime) and the like are preferred. The aforementioned O-acyloxime compound (C-1) can be used alone or in combinations of two or more depending on actual requirement. When the photosensitive resin composition has no O-acyloxime compound (C-1), the resulted photosensitive resin composition would have disadvantages such as poor adhesiveness after being developed.

Examples of the triazine compound include: vinyl-halomethyl-s-triazine compounds, 2-(naphth-1-yl)-4,6-bis-halomethyl-s-triazine compounds and 4-(p-aminophenyl)-2,6-di-halomethyl-s-triazine compounds.

Examples of the vinyl-halomethyl-s-triazine compounds include: 2,4-bis(trichloromethyl)-6-(p-methoxy)styryl-s-triazine, 2,4-bis(trichloromethyl)-3-(1-p-dimethylaminophenyl-1,3-butadienyl)-s-triazine, 2-trichloromethyl-3-amino-6-(p-methoxy)styryl-s-triazine and the like.

Examples of the 2-(naphth-1-yl)-4,6-bis-halomethyl-s-triazine compounds include: 2-(naphtha-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-(4-(2-methoxyethyl-naphtho-1-yl)-4,6-bis-trichloromethyl-s-triazine, 2-(4-(2-ethoxyethyl-naphtho-1-yl)-4,6-bis-trichloromethyl-s triazine, 2-(4-(2-butoxyethyl-naphtho-1-yl)-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl) 4,6-bis-trichloromethyl-s-triazine, 2-(4,5-dimethoxy-naphtho-1-yl)-4,6-bis-trichloromethyl-s-triazine and the like.

Examples of the 4-(p-aminophenyl)-2,6-di-halomethyl-s-triazine compounds include: 4-[p-N,N-di(ethoxycarbonylmethyl)aminophenyl]-2,6-di (trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di (trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenypaminophenyl)-2,6-di(trichloromethyl)-s-triazine, 4-[p-N-chloro ethylcarbonylaminophenyl]-2,6-di(trichloromethyl)-s-triazine, 4-[p-N-(p-methoxy phenyl)carbonylaminophenyl]-2,6-di (tichloromethyl)-s-triazine, 4-[m-N,N-di(ethoxycarbonylmethyl)aminophenyl]-2,6-di (trichloromethyl)-s-triazine, 4-[m-bromo-p-N,N-di(ethoxycarbonylmethyl)aminophenyl]-2,6-di (trichloromethyl)-s-triazine, 4-[m-chloro-p-N,N-di(ethoxycarbonylmethyl)aminophenyl]-2,6-di (trichloromethyl)-s-triazine, 4-[m-fluoro-p-N,N-di(ethoxycarbonylmethyl)aminophenyl]-2,6-di (trichloromethyl)-s-triazine, 4-[o-bromo-p-N,N-di(ethoxy carbonylmethyl)aminophenyl]-2,6-di(trichloromethyl)-s-triazine, 4-[o-chloro-p-N,N-di(ethoxycarbonylmethyl) aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-(o-bromo-N,N-di (chloroethyl)aminophenyl-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di (chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s triazine, 4-(m-bromo-p-N-ethoxycarbonylmethylamino phenyl)-2,6-di(trichloromethyl)-s-triazine, 4-(m-chloro-p-N-ethoxycarbonylmethyl aminophenyl)-2,6-di(trichloromethyl)-s-triazine, 4-(m-fluoro-p-N-ethoxycarbonyl methylaminophenyl)-2,6-di(trichloromethyl)-s-triazine, 4-(o-bromo-p-N-ethoxy carbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, 2,4-bis(trichloromethyl)-6-[3-bromo-4-[N,N-di(ethoxycarbonylmethyl) amino]-phenyl]-1,3,5-triazine and the like.

Among those triazine compounds, 4-[m-bromo-p-N,N-di(ethoxycarbonylmethyl)aminophenyl]-2,6-di(trichloromethyl)-s-triazine and 2,4-bis(trichloromethyl)-6-(p-methoxy)styryl-s-triazine are preferred. The aforementioned triazine compounds can be used alone or in combinations of two or more depending on actual requirement.

Examples of the acetophenone compound include: p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, 2-benzyl-2-N,N-dimethylamino-1-(4-morpholinophenyl)-1-butanone and the like. Among those acetophenone compounds, 2-methyl-1-(4-methylthiophenyl)-2-morpholino-1-propanone, 2-benzyl-2-N,N-dimethylamino-1-(4-morpholinophenyl)-1-butanone and the like are preferred. The aforementioned acetophenone compounds can be used alone or in combinations of two or more depending on actual requirement.

Examples of the diimidazole compound include: 2,2'-bis(o-chlorophenyl)-4,4',5,5'-tetraphenylbiimidazole, 2,2'-bis(o-fluorophenyl)-4,4',5,5'-tetraphenyl biimidazole, 2,2'-bis(2,4-dichlorophenyl)-4,4',5,5'-tetraphenylbiimidazole, 2,2'-bis(o-methoxyphenyl)-4,4',5,5'-tetraphenylbiimidazole, 2,2'-bis(o-ethoxyphenyl)-4,4',5,5'-tetraphenylbiimidazole, 2,2'-bis(p-methoxyphenyl)-4,4',5,5'-tetraphenyl biimidazole, 2,2,-bis(2,2',4,4'-tetramethoxyphenyl)-4,4',5,5'-tetraphenyl biimidazole, 2,2,-bis(2-chlorophenyl)-4,4',5,5'-tetraphenyl biimidazole, 2,2,-bis(2,4-dichlorophenyl)-4,4',5,5'-tetraphenylbiimidazole and so on. Among those examples, 2,2,-bis(2,4-dichlorophenyl)-4,4',5,5'-tetraphenylbiimidazole is preferred. The aforementioned diimidazole compound can be used alone or in combinations of two or more depending on actual requirement.

Examples of the benzophenone compound include: thioxanthone, 2,4-diethyl thioxanthone, thioxanthone-4-sulfone, benzophenone, 4,4'-bis (dimethylamino)benzophenone, 4,4'-bis(diethylamine)benzophenone and so on. Among those examples, 4,4'-bis(diethylamine)benzophenone is preferred. The aforementioned benzophenone compound can be used alone or in combinations of two or more depending on actual requirement.

Examples of the α-dione compound include: benzil, acetyl and so on. Examples of the acyloin compound include: benzoin. Examples of the acyloin ether compound include: diphenylethyl ether ketone (benzoin methyl ether), benzoin ethylether, benzoin isopropyl ether and so on. Examples of the acylphosphineoxide compound include: 2,4,6-trimethyl-benzoyl diphenylphosphineoxide, bis-(2,6-dimethoxy-benzoyl)-2,4,4-trimethylbenzyl phosphineoxide and so on. Examples of the quinone compound include: anthraquinone, 1,4-naphthoquinone and so on. Examples of the halogen-containing compound include: phenacyl chloride, tribromomethyl phenylsulfone, tris(trichloromethyl)-s-triazine and so on. Examples of the peroxide include: di-tertbutylperoxide and so on. The aforementioned α-dione compound, acyloin compound, acyloin ether compound, acylphosphineoxide compound, quinone compound, halogen-containing compound, peroxide and the like can be used alone or in combinations of two or more depending on actual requirement.

The amount of the photoinitiator (C) of the present invention can be adjusted depending on the actual requirement. In an example of the present invention, based on the amount of the compound containing vinyl unsaturated group(s) (B) as 100 parts by weight, the amount of the photoinitiator (C) is 20 to 100 parts by weight, preferably 25 to 90 parts by weight, and more preferably 30 to 80 parts by weight. Moreover, based on the amount of the compound containing vinyl unsaturated group(s) (B) as 100 parts by weight, the amount of O-acyloxime compound (C-1) is 10 to 90 parts by weight, preferably 20 to 90 parts by weight, and more preferably 30 to 90 parts by weight. When the photosensitive resin composition has no O-acyloxime compound (C-1), the resulted photosensitive resin composition would have disadvantages such as poor adhesiveness after being developed.

Quinonediazide Sulfonic Acid Ester (D)

The quinonediazide sulfonic acid ester (D) of the present photosensitive resin composition can be selected from the conventionally common ones without any specific limitation. In preferred examples of the present invention, the above-mentioned quinonediazide sulfonic acid ester (D) can be esterified completely or partially; however, esters of ortho-naphthoquinone diazide sulfonic acid (or its salt) and a hydroxyl compound are preferred, and more preferably the esters of ortho-naphthoquinone diazide sulfonic acid (or its salt) and a polyhydroxyl compound.

The aforementioned ortho-naphthoquinone diazide sulfonic acid can include but be not limited to ortho-naphthoquinone diazide-4-sulfonic acid, ortho-naphthoquinone diazide-5-sulfonic acid, ortho-naphthoquinone diazide-6-sulfonic acid and the like. The aforementioned salt of ortho-naphthoquinone diazide sulfonic acid can include but be not limited to ortho-naphthoquinone diazide sulfonyl halides.

The aforementioned hydroxyl compound, which may be used alone or in combinations of two or more, which can include but be not limited to:

(1) The hydroxybenzophenones can include but be not limited to: 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, 2,3,4,3',4',5'-hexahydroxy benzophenone and the like.

(2) The hydroxyl aryl compound can include but be not limited to a structure as in Formula (III):

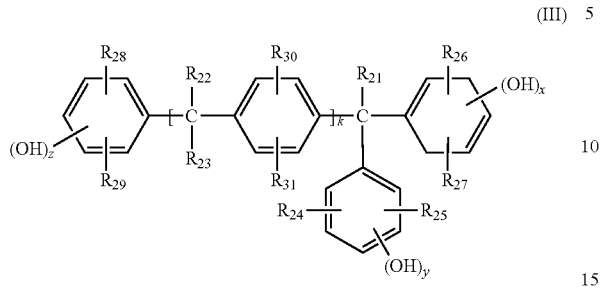

In Formula (III), $R_{21}$ to $R_{23}$ are the same or different from each other, each of which independently represents a hydrogen atom or a $C_1$ to $C_6$ alkyl group; $R_{24}$-$R_{29}$ are the same or different from each other, each of which independently represents a hydrogen atom, a halogen atom, a $C_1$ to $C_6$ alkyl group, a $C_1$ to $C_6$ alkoxy group, a $C_1$ to $C_6$ alkenyl group and a cycloalkyl group; $R_{30}$ and $R_{31}$ are the same or different from each other, each of which independently represents a hydrogen atom, a halogen atom and a $C_1$ to $C_6$ alkyl group; x, y and z each independently represents a integer of 1 to 3; and k is 0 or 1. The examples of the hydroxyl aryl compound with a structure shown in Formula (III) can include but be not limited to: tris(4-hydroxylphenyl)methane, bi(4-hydroxyl-3,5-dimethylphenyl)-4-hydroxylphenyl methane, bi(4-hydroxyl-3,5-dimethyl phenyl)-3-hydroxylphenyl methane, bi(4-hydroxyl-3,5-dimethylphenyl)-2-hydroxylphenyl methane, bi(4-hydroxyl-2,5-dimethylphenyl)-4-hydroxylphenyl methane, bi(4-hydroxyl-2,5-dimethylphenyl)-3-hydroxylphenyl methane, bi(4-hydroxyl-2,5-dimethylphenyl)-2-hydroxylphenyl methane, bi(4-hydroxyl-3,5-dimethylphenyl)-3,4-dihydroxylphenyl methane, bi(4-hydroxyl-2,5-dimethylphenyl)-3,4-dihydroxylphenyl methane, bi(4-hydroxyl-3,5-dimethylphenyl)-2,4-dihydroxylphenyl methane, bi(4-hydroxyl-2,5-dimethylphenyl)-2,4-dihydroxylphenyl methane, bi(4-hydroxyl phenyl)-3-methoxyl-4-hydroxylphenyl methane, bi(3-cyclohexyl-4-hydroxylphenyl)-3-hydroxylphenyl methane, bi(3-cyclohexyl-4-hydroxylphenyl)-2-hydroxylphenyl methane, bi(3-cyclohexyl-4-hydroxylphenyl)-4-hydroxylphenyl methane, bi(3-cyclohexyl-4-hydroxyl-6-methyl aryl)-2-hydroxylphenyl methane, bi(3-cyclohexyl-4-hydroxyl-6-methylphenyl)-3-hydroxylphenyl methane, bi(3-cyclohexyl-4-hydroxyl-6-methylphenyl)-4-hydroxylphenyl methane, bi(3-cyclohexyl-4-hydroxyl-6-methylphenyl)-3,4-dihydroxylphenyl methane, bi(3-cyclohexyl-6-hydroxylphenyl)-3-hydroxylphenyl methane, bi(3-cyclohexyl-6-hydroxylphenyl)-4-hydroxylphenyl methane, bi(3-cyclohexyl-6-hydroxylphenyl)-2-hydroxylphenyl methane, bi(3-cyclohexyl-6-hydroxyl-4-methylphenyl)-2-hydroxylphenyl methane, bi(3-cyclohexyl-6-hydroxyl-4-methylphenyl)-4-hydroxylphenyl methane, bi(3-cyclohexyl-6-hydroxyl-4-methylphenyl)-3,4-dihydroxylphenyl methane, 4,4'-[1-[4-[-1-(4-hydroxylphenyl)-1-methylethyl] phenyl] ethylidene] bisphenol, 1-[1-(3-methyl-4-hydroxylphenyl) isopropyl]-4-[1,1-bi(3-methyl-4-hydroxylphenyl) ethyl] benzene and the like.

(3) The (hydroxylphenyl)hydrocarbon compound can include but be not limited to a structure as shown in Formula (IV) as follows:

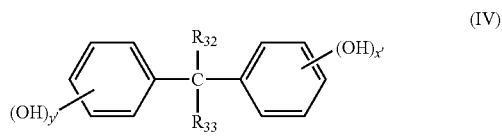

In Formula (IV), $R_{32}$ and $R_{33}$ are the same or different from each other, each of which independently represents a hydrogen atom or a $C_1$ to $C_6$ alkyl group; and x' and y' each independently represents an integer of 1 to 3. Specific examples of the (hydroxylphenyl)hydrocarbon compound with a structure as shown in Formula (IV) can include but be not limited to: 2-(2,3,4-trihydroxylphenyl)-2-(2',3',4'-trihydroxylphenyl) propane, 2-(2,4-dihydroxylphenyl)-2-(2',4'-dihydroxylphenyl) propane, 2-(4-hydroxylphenyl)-2-(4'-hydroxylphenyl) propane, bi(2,3,4-trihydroxylphenyl) methane, bi(2,4-dihydroxylphenyl)methane and the like.

(4) Other aromatic hydroxyl compounds can include but be not limited to: phenol, p-metoxyphenol, xylenol, hydroquinone, bisphenol A, naphthol, pyrocatechol, 1,2,3-pyrogallol monomethyl ether, 1,2,3-pyrogallol-1,3-dimethyl ether, 3,4,5-gallic acid, 3,4,5-gallic acid that is esterified or etherified partially and the like.

Among the aforementioned hydroxyl compounds, 2,3,4-trihydroxybenzophenone, 1-[1-(4-hydroxylphenyl) isopropyl]-4-[1,1-bi(4-hydroxylphenyl)ethyl]benzene, 2,3,4,4'-tetrahydroxybenzophenone and 4,4'-[1-[4-[-1-(4-hydroxyphenyl)-1-methylethyl]phenyl]ethylidene] bisphenol are preferred. Those hydroxyl compounds can be used alone or in combinations of two or more depending on actual requirement.

The aforementioned ortho-naphthoquinone diazide sulfonic acid (or its salt) generally reacts with the hydroxyl compound in organic solvents such as dioxane, N-pyrrolidone, acetamide and the like, and preferably in the presence of alkaline condensing agents such as triethanolamine, alkali carbonate or alkali bicarbonate.

In preferred examples of the present invention, based on the total amount of the hydroxyl groups in the hydroxyl compound as 100 mole %, preferably more than 50 mole %, and more preferably more than 60 mole % of the hydroxyl compound and the ortho-naphthoquinone diazide sulfonic acid (or its salt) both of which are condensed to the quinonediazide sulfonic acid ester (D) having an esterification degree of more than 50% and preferably more than 60%.

Based on the amount of the novolac resin (A) as 100 parts by weight, an amount of the quinonediazide sulfonic acid ester (D) is generally 3 to 40 parts by weight, preferably 10 to 40 parts by weight, more preferably 20 to 40 parts by weight. When the photosensitive resin composition has no quinonediazide sulfonic acid ester (D), the resulted photosensitive resin composition would have disadvantages of residues. When the photosensitive resin composition has includes the aforementioned amounts of the quinonediazide sulfonic acid ester (D), the quinonediazide sulfonic acid ester (D) can generate acids after the photosensitive resin composition is developed, for increasing the development ability near the exposed side of being-developed photoresist, thereby hardly remaining residues.

Solvent (E)

It is preferable that the solvent (E) of the present invention evaporates properly, dissolves but not reacts with the alkali-soluble resin (A), the compound containing vinyl unsaturated group(s) (B), the photo initiator (C) and the quinone-diazide sulfonic acid ester (D).

Examples of the aforementioned solvent (E) include: alkylene glycol monoalkyl ethers such as ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether and the like; alkylene glycol monoalkyl ether acetates such as ethylene glycol monomethyl ether acetate, ethylene glycol monoethyl ether acetate, propylene glycol monomethyl ether acetate, propylene glycol monoethyl ether acetate and the like; other ethers such as diethylene glycol dimethyl ether, diethylene glycol methyl ethyl ether, diethylene glycol diethyl ether, tetrahydrofuran and the like; ketones such as methyl ethyl ketone, cyclohexanone, 2-heptanone, 3-heptanone, diacetone alcohol and the like; alkyl lactates such as methyl lactate, ethyl lactate and the like; other esters such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate, ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, ethyl 2-oxybutyrate and the like; aromatic hydrocarbons such as toluene, xylene and the like; carboxylic amines such as N-methylpyrrolidone, N,N-dimethylformamide, N,N-dimethylacetamide and the like; and any combination thereof. The above-mentioned solvent (E) can be used alone or in combinations of two or more.

Based on the total amount of the alkali-soluble resin (A) as 100 parts by weight, the amount of the solvent (E) is 500 to 5,000 parts by weight, preferably 800 to 4,700 parts by weight, and more preferably 1,000 to 4,500 parts by weight.

Black Pigment (F)

It is suitable that the black pigment (F) of the present invention is resistant to heat, light and solvents.

Examples of the black pigment (F) include: perylene black, cyanine black, aniline black and the like; organic near-black pigments mixed with at least two pigments selected from the group consisted of red, blue, green, purple, yellow, cyanine, magenta pigments and the like; light-shielding materials such as carbon black, chromium oxide, iron oxide, titanium black, graphite and the like. The carbon black can include but be not limited to C.I. pigment black 7 and the like, examples of which include MA100, MA230, MA8, #970, #1000, #2350, #2650, all commercially available from Mitsubishi Chemical Co. The above-mentioned black pigment (F) can be used alone or in combinations of two or more.

Based on the total amount of the alkali-soluble resin (A) as 100 parts by weight, the amount of the black pigment (F) is 100 to 1000 parts by weight, preferably 300 to 1000 parts by weight, and more preferably 300 to 800 parts by weight.

Additive (G)

In consideration of no substantially adverse influence of the present invention, the aforementioned photosensitive resin composition optionally includes an additive (G) that includes but is not limited to a surfactant, a filling agent, an adhesiveness improver, a crosslinking agent, an antioxidant, an anti-agglutinating agent, other polymer for improving various functions (for example, mechanical properties) except from the alkali-soluble resin (A) and the like.

Examples of the surfactant can include but are not limited to cationic, anioic, nonionic, zwitterionic, polysiloxane, fluorine surfactants and any combination thereof. More specifically, examples of the surfactant can include but are not limited to polyoxyethylene allyl ethers such as polyoxyethylene dodecyl ether, polyoxyethylene stearamide ether, polyoxyethylene oleyl ether and the like; polyoxyethylene allyl phenyl ethers such as polyoxyethylene octyl phenyl ether, polyoxyethylene nonyl phenyl ether and the like; polyethylene glycol diesters such as polyethylene glycol dilaurate, polyethylene glycol distearate and the like; sorbitan fatty acid esters; fatty acid-modified polyesters; and tertiary amine-modified polyurethanes. The above-mentioned surfactant can be used alone or in combinations of two or more.

Suitable examples of the surfactants include: the trade names of KP (manufactured by SHIN-ETSU CHEMICAL Co. Ltd.), SF-8427 (manufactured by TORAY DOW CORNING SILICON Co., Ltd.), Polyflow (manufactured by KYOEISHA CHEMICAL Co., Ltd.), F-Top (manufactured by TOCHEM PRODUCT Co., Ltd.), Megafac (manufactured by DAINIPPON INK AND CHEMICALS Inc.), Fluorade (manufactured by SUMITOMO 3M Ltd.), Asahi Guard, Surflon (manufactured by ASAHI GLASS Co., Ltd.) or SINOPOL E8008 (manufactured by SINO-JAPAN CHEMICAL CO., Ltd.) and the like.

Suitable examples of the filling agent can include: glass, aluminum and the like.

Examples of the adhesiveness improver can include: vinyltrimethoxysilane, vinyltriethoxysilane, vinyl tris(2-methoxyethoxy) silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyldimethoxysilane, 3-glycidoxypropyl methyl diethoxysilane, 2-(3,4-epoxycyclohexyl)ethyl trimethoxysilane, 3-chloro propylmethyldimethoxysilane, 3-chloropropyltrimethoxysilane, 3-methacryloxy propyl trimethoxysilane, 3-mercaptopropyl trimethoxysilane and the like.

Examples of the antioxidant can include but are not limited to: 2,2'-thio-bis(4-methyl-6-t-butylphenol) or 2,6-di-t-butylphenol and the like.

Examples of the anti-agglutinating agent can include but are not limited to sodium polyacrylate and the like.

Examples of the crosslinking agent can include but are not limited to: epoxy compounds or resins, such as 1031S, 157S-70 (manufactured by Japan Epoxy Resins Co., Ltd.).

Based on the total amount of the alkali-soluble resin (A) as 100 parts by weight, an amount of the additive (G), such as the filling agent, the adhesiveness improver, the antioxidant, the anti-agglutinating agent or the other polymer for improving various functions except from the alkali-soluble resin (A), is typically less than 10 parts by weight, preferably less than 6 parts by weight.

Based on the total amount of the alkali-soluble resin (A) as 100 parts by weight, an amount of the additive (G) such as the surfactant is typically less than 6 parts by weight, preferably less than 4 parts by weight.

Based on the total amount of the alkali-soluble resin (A) as 100 parts by weight, an amount of the additive (G) such as the crosslinking agent is typically less than 100 parts by weight, preferably less than 80 parts by weight.

Preparation of Photosensitive Resin Composition

The photosensitive resin composition of the present invention can be prepared by mixing the alkali-soluble resin (A), the compound containing vinyl unsaturated group(s) (B), the photoinitiator (C), the quinonediazide sulfonic acid ester (D), the solvent (E), the black pigment (F) and the light stabilizer (G) are mixed well in a mixer until all components are formed into a solution state. The photosensitive resin composition is optionally added with the surfactant, the filling agent, the adhesiveness improver, the crosslinking agent, the antioxidant, the anti-agglutinating agent and the like as necessary.

Based on the total amount of the alkali-soluble resin (A) as 100 parts by weight, the amount of the resin having unsaturated group(s) (A-1) is 30 to 100 parts by weight, the amount of the compound containing vinyl unsaturated group(s) (B) is 20 to 180 parts by weight, the amount of the quinonediazide sulfonic acid ester (D) is 3 to 40 parts by weight, the amount of the solvent (E) is 500 to 5,000 parts by weight, and the amount of the black pigment (F) is 100 to 1000 parts by weight. Moreover, based on the amount of the compound containing vinyl unsaturated group(s) (B) as 100 parts by weight, the amount of the photo initiator (C) is 20 to 100 parts by weight. Furthermore, based on the amount of the compound containing vinyl unsaturated group(s) (B) as 100 parts by weight, the amount of the O-acyloxime compound (C-1) is 10 to 90 parts by weight.

In addition, there are no limitations specific to the preparation of the photosensitive resin composition. For example, the black pigment (F) can be directly added into and dispersed in the photosensitive resin composition. Alternatively, a pigment dispersion can be prepared by dispersing the black pigment (F) in a medium of a part of the alkali-soluble resin (A) and the solvent (E), and then it is mixed with the compound containing vinyl unsaturated group(s) (B), the photoinitiator (C), the quinonediazide sulfonic acid ester (D), and the remaining part of the alkali-soluble resin (A) and the solvent (E), so as to obtain the photosensitive resin composition. During the dispersion of the black pigment (F), all components can be mixed well by a mixer such as a beads mill, a roll mill or the like.

Method of Forming Black Matrix

The photosensitive resin composition of the present invention can be subjected to a prebake step, an exposure step, a development step and a postbake step, so as to forming black matrix on a substrate. When the black matrix is formed with a film thickness of 1 μm by the photosensitive resin composition, the black matrix has an optical density more than 3.0, preferably an optical density of 3.2 to 5.5, and more preferably 3.5 to 5.5.

Specifically, during the formation of the black matrix, the photosensitive resin composition can be applied on the substrate by various coating methods, for example, spin coating, cast coating or roll coating methods. And then, the coated resin composition is dried under reduced pressure and prebaked to remove the solvent, thereby forming a prebaked and coated film. The step of dehydration under reduced pressure and prebake is carried out in various conditions, for example, dehydration under reduced pressure of less than 200 mmHg for 1 to 20 seconds, and prebake at 70 to 110° C. for 1 to 15 minutes, which depend upon the kinds and the mixing ratio of components. After the prebake step, the prebaked and coated film is exposed under a given mask, and then immersed in a developing solution at 23±2° C. for 15 seconds to 5 minutes, thereby removing undesired areas and forming a given pattern. The exposure light is preferably UV light such as g-line, h-line, i-line and so on, which may be generated by a UV illumination device such as (super) high-pressure mercury lamp or metal halide lamp.

Specific examples of the developing solution include but are not limited to alkaline compounds such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-[5,4,0]-7-undecene and the like. The concentration of the developing solution is preferably 0.001 weight percent (wt %) to 10 wt %, more preferably 0.005 wt % to 5 wt %, and much more preferably 0.01 wt % to 1 wt %.

When the aforementioned alkaline compounds are included in the developing solution, the coated film can be washed by water after being developed, and then be dried by using compressed air or nitrogen gas. Next, a hot plate, an oven or other heating device is used to postbake the coated film. The postbake step can be carried out at 150° C. to 250° C. for 5 to 60 minutes on the hot plate or for 15 to 150 minutes in the oven. After those steps, the black matrix is formed on the substrate.

Specific examples of the aforementioned substrate include but are not limited to alkali-free glass, Na—Ca glass, hard glass (Pyrex glass) and a quartz glass utilized in the LCD, and those having an electrically conductive transparent film disposed thereon; a substrate of light-to-electricity conversion (for example, silicone substrate) utilized in solid-camera device and the like.

Method of Producing Pixel Layer and Color Filter

The method of producing a color filter (CF) is based on the aforementioned method of forming the black matrix. Similarly, a solution state of the photosensitive resin composition for a color filter is applied on a substrate by various coating methods, for example, spin coating, cast coating or roll coating methods, for forming a colored photosensitive layer, in which the aforementioned substrate has the black matrix formed thereon for separating each pixel region. After removal of most solvent in the photosensitive resin composition for the color filter by using low-pressure dehydration, a prebake treatment is further subjected to the photosensitive resin composition for removing the remaining solvent and forming a prebaked coating film. The low-pressure dehydration and the prebake treatment are carried out in various conditions, which depend upon the kinds and the mixing ratio of components. Typically, the low-pressure dehydration is carried out under a pressure of 0 mmHg to 200 mmHg for 1 second to 60 seconds, and the prebake treatment is carried out under 70° C. to 110° C. for 1 minute to 15 minutes. After the prebake treatment, the prebaked coating film is exposed under the given mask, and then developed in a developer under 23±2° C. for 15 seconds to 5 minutes, thereby removing undesired areas and forming a given pattern. The exposure light is preferably UV light such as g-line, h-line, i-line and so on, which may be generated by a UV illumination device such as (super) high-pressure mercury lamp or metal halide lamp. After being developed and washed, the given pattern is dried by using compressed air or nitrogen gas. Next, a hot plate, an oven or other heating device is used to postbake the coated film. The postbake step can be carried out in the above-mentioned conditions without reciting them in detail again.

Each pixel layer (including three primary colors of red, green and blue colors) of the color filter can be made by repeating the above-mentioned steps. Moreover, an evaporated indium-tin oxide (ITO) film can be formed on the pixel layer under 220° C. to 25° C. in a vacuum environment. After the evaporated ITO film can be etched and wired, if necessary, a polyimide for a LC alignment film can be coated on the evaporated ITO film and burnt, resulting in the color filter for a LCD device.

Method of Producing LCD Device

The LCD device of the present invention comprises the color filter substrate formed by the aforementioned method and a TFT array substrate (driver substrate). The aforementioned TFT array substrate (driver substrate) and the color filter (CF) substrate are disposed oppositely, spacers (or called as cell gaps) are disposed there between and the edges of the two substrates are adhered by a curing agent for forming a space. LC material is filled into the space through a sealing hole, and the sealing hole is sealed to form a LC cell. And then, a polarizer is adhered onto one side or both sides of the LC cell, so as to assemble the LCD device.

The aforementioned LC material can be any prior LC compound or composition without any limitation.

Furthermore, the LC alignment film can be any inorganic or organic substance for restriction of the orientation of the LC molecules but no further specific limitation thereto the LC alignment film. The method of forming LC alignment film can be carried out by any widely known method rather than focusing or mentioning them in details.

Thereinafter, various applications of the present invention will be described in more details referring to several exemplary embodiments below, while not intended to be limiting. Thus, one skilled in the art can easily ascertain the essential characteristics of the present invention and, without departing from the spirit and scope thereof, can make various changes and modifications of the invention to adapt it to various usages and conditions.

BRIEF DESCRIPTION OF THE DRAWINGS

No drawings.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

EXAMPLES

Synthesis Example 1L Method of Synthesizing Resin Having Unsaturated Group(s) (A-1-1)

The components comprising 100 parts by weight of the fluorine compound containing epoxy group(s) (trade name ESF-300, manufactured by NIPPON STEEL CHEMICAL Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 6 parts by weight of tetrahydrophthalic anhydride and 13 parts by weight of benzophenone tetracarboxylic dianhydride (BTDA) were also added thereto, followed by heating the reaction to 110° C. to 115° C. for 2 hours, thereby obtaining the resin having unsaturated group(s) (A-1-1) with acid value of 98.0 mg KOH/g.

Synthesis Example 2: Method of Synthesizing Resin Having Unsaturated Group(s) (A-1-2)

The components comprising 100 parts by weight of the fluorine compound containing epoxy group(s) (trade name ESF-300, manufactured by NIPPON STEEL CHEMICAL Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 13 parts by weight of tetrahydrophthalic anhydride, for reacting under 90° C. to 95° C. for 2 hours. And then, and 6 parts by weight of tetrahydrophthalic anhydride were added to the above-mentioned reactant, followed by heating the reaction to 90° C. to 95° C. for 4 hours, thereby obtaining the resin having unsaturated group(s) (A-1-2) with acid value of 99.0 mg KOH/g.

Synthesis Example 3: Method of Synthesizing Resin Having Unsaturated Group(s) (A-1-3)

The components comprising 400 parts by weight of the epoxy compound (trade name NC-3000, manufactured by NIPPON KAYAKU Co., Ltd.; epoxy equivalent per weight: 228), 102 parts by weight of the acrylic acid, 0.3 parts by weight of the methoxyphenol, 5 parts by weight of the triphenyl phosphine and 264 parts by weight of the propylene glycol methyl ether acetate were continuously charged to the flask as above-mentioned, for reacting under 95° C. to polymerize for 9 hours. After the reaction was completed, an intermediate product with acid value of 2.2 mg KOH/g was obtained. Next, the resulted intermediate product was added with 151 parts by weight of tetrahydrophthalic anhydride, for reacting under 95° C. for 4 hours, thereby obtaining the resin having unsaturated group(s) (A-1-3) with acid value of 102 mg KOH/g and averaged molecular weight of 3,200.

Synthesis Example 4: Method of Synthesizing Other Alkali-Soluble Resin (A-2-1)

The components comprising 1 parts by weight of 2,2'-azobis (isobutyronitrile), 240 parts by weight of the propylene glycol monomethyl ether acetate, 20 parts by weight of the methacrylic acid, 15 parts by weight of the styrene, 35 parts by weight of methyl methacrylate, 10 parts by weight of glycerol monomethacrylate and 20 parts by weight of N-phenyl maleimide were continuously charged to a round-bottom flask that was equipped with a stirrer and a condenser and purged with nitrogen gas. Next, the reaction solution was slowly stirred and heated to 80° C. to polymerize for 4 hours. Afterward, the reaction solution was further heated to 100° C. and added with 0.5 parts by weight of 2,2'-azobis (isobutyronitrile) to polymerize for 1 hour, thereby obtaining the other alkali-soluble resin (A-2-1).

Synthesis Example 5: Method of Synthesizing Other Alkali-Soluble Resin (A-2-2)

The components comprising 2 parts by weight of 2,2'-azobis (isobutyronitrile), 300 parts by weight of the propylene glycol monomethyl ether, 15 parts by weight of the methacrylic acid, 15 parts by weight of ethyl 2-hydroxyacrylate and 70 parts by weight of benzyl methacrylate were continuously charged to a round-bottom flask that was equipped with a stirrer and a condenser and purged with nitrogen gas. Next, the reaction solution was slowly stirred and heated to 80° C. to polymerize for 3 hours. Afterward, the reaction solution was further heated to 100° C. and added with 0.5 parts by weight of 2,2'-azobis(isobutyronitrile) to polymerize for 1 hour, thereby obtaining the other alkali-soluble resin (A-2-2).

Method of Manufacturing Photosensitive Resin Composition

The following examples are directed to the preparation of the photosensitive resin composition of Examples 1 to 7 and Comparative Examples 1 to 7 according to TABLE 1.

Example 1

100 parts by weight of the resin having unsaturated group(s) (A-1-1) of Synthesis Example 1, 60 parts by weight of the dipentaerythritol hexaacrylate (B-1), 30 parts by weight of ethanone, 1-[9-ethyl-6-(2-methylbezoyl)-9H-carbozole-3-yl]-1-(O-acetyl oxime) (the trade name OXE02, manufactured by Ciba Specialty Chemicals Co.; C-1-1), 20 parts by weight of the ortho-naphthoquinone diazide sulfonic acid ester of 4,4'-[1-[4-[-1-(4-hydroxyphenyl)-1-methylethyl]phenyl]ethylidene]bisphenol and ortho-naphthoquinone diazide-5-sulfonic acid (D-1), 300 parts by weight of the black pigment of the C.I. pigment black 7 (the trade name MA100, manufactured by Mitsubishi Chemical Co.; F-1), 100 parts by weight of another black pigment of the C.I. pigment black 7 (the trade name MA230, manufactured by Mitsubishi Chemical Co.; F-2), 2,000 parts by weight of propylene glycol monomethyl ether acetate (E-1) and 500 parts by weight of ethyl 3-ethoxypropanoate (E-2) were stirred and mixed well in a shaking mixer, so as to form a solution state of a photosensitive resin composition of Example 1. And then, the properties of the photosensitive resin composition were determined by using the following evaluation methods and resulted in TABLE 1. The detection methods were described as follows.

Examples 2 to 7 and Comparative Examples 1 to 7

Examples 2 to 7 and Comparative Examples 1 to 7 were practiced with the same method as in Example 1 by using various kinds or usage of the components. The formulation, the details and the evaluation results were listed in TABLE 1 (Examples 1 to 7 and Comparative Examples 1 to 7) rather than focusing or mentioning them in details.

Method of Manufacturing Black Matrix

Application Example 1

The photosensitive resin composition of Example 1 was coated unto a glass substrate (100 mm×100 mm) by a spin-coater (Opticoat MS-A150, MIKASA. Co., Tokyo, Japan). And then, the coated resin composition was dehydration under reduced pressure of 100 mmHg for 5 seconds and prebaked in an oven at 85° C. for 3 minutes, so as to form a prebaked and coated film with a thickness of about 1.2 μm.

Next, the prebaked and coated film was exposed under a given mask by using UV light (AG500-4N; manufactured by M&R Nano Technology) in 200 mJ/cm$^2$, immersed in a developing solution (0.04% potassium hydroxide) at 23° C. for 2 minutes, washed by water, and then postbaked at 230° C. for 60 minutes, thereby forming a black matrix (or called as a shielding layer) with a thickness of 1.0 μm. The resulted black matrix was evaluated by the following methods and the results were listed as TABLE 1.

Application Examples 2 to 7 and Comparative Application Examples 1 to 7

The black matrixes (or called as the shielding layers) of Application Examples 2 to 7 and Comparative Application Examples 1 to 7 were practiced with the same method as in Application Example 1 by using various kinds or usage of the components. The formulation, the amount of the components and the evaluation results were listed in TABLE 1 (Application Examples 1 to 7) and TABLE 2 (Comparative Application Examples 1 to 7) rather than focusing or mentioning them in details.

Evaluation Methods

The adhesiveness and residue after being developed of the above-mentioned photosensitive resin compositions and the black matrixes (or called as the shielding layers) by using the same were assessed by using the following evaluation methods under low-luminance of the exposure condition.

1. Adhesiveness after being Developed

The prebaked and coated films having 1.2 μm of thickness of EXAMPLES 1 to 7 and COMPARATIVE EXAMPLES 1 to 7 were exposed under a given mask by using UV light (provided by a exposure machine, for example, Model No. AG500-4N, manufactured by M&R Nano Technology Co. Ltd.) in 100 mJ/cm$^2$, immersed in a developing solution (0.04% potassium hydroxide) at 23° C. for 2 minutes. After removing the unexposed portion, 100 columns with a diameter of 20 μm were developed, washed by water, observed by a microscope (Eclipse 50i, manufactured by Nikon) for counting the number of developable columns, thereby evaluating the adhesiveness after being developed according to the following criteria:

○: 0≤Numbers of Damaged Columns per 100 Columns <5

Δ: 5≤Numbers of Damaged Columns per 100 Columns <10 x: 10≤Numbers of Damaged Columns per 100 Columns

2. Residue after being Developed

Those prebaked and coated films having 1.2 μm of thickness were exposed under a given mask by using UV light (provided by a exposure machine, for example, Model No. PLA-501F, manufactured by Canon Co. Ltd.) in 100 mJ/cm$^2$, immersed in a developing solution (0.04% potassium hydroxide) at 23° C. for 1 minute. And then, the unexposed portion was removed, washed by water and postbaked at 235° C. for 30 minutes, so that a desired photosensitive resin pattern was formed on a glass substrate. The residue from the unexposed portion was observed and determined by a microscope, thereby evaluating the residue after being developed according to the following criteria:
○: No residue
Δ: A little residue
x: Many residues According to the results of Examples 1 to 7 listed in TABLE 1, the resulted photosensitive resin compositions will exhibit excellent adhesiveness after being developed if such resin compositions include specific amounts of the alkali-soluble resin (A), the compound containing vinyl unsaturated group(s) (B), the photo initiator (C), the quinonediazide sulfonic acid ester (D), the solvent (E) and the black pigment (F), and the patterns formed by such prebaked and coated films has no residue from the unexposed portion after being developed, thereby achieving the purpose of the present invention. In comparison, the adhesiveness of the resin layer of Comparative Examples 1 to 7 as listed in TABLE 1 are worse after being developed, and some residues from the unexposed portion often occurs after being developed.

It is necessarily supplemented that, specific compounds, specific compositions, specific reaction conditions, specific processes, specific evaluation methods or specific instruments are employed as exemplary embodiments in the present invention, for illustrating the photosensitive resin composition and the color filter by using the same in the present invention. However, as is understood by a person skilled in the art, the photosensitive resin composition and the method for forming patterns by using the same in the present invention can include other compounds, other compositions, other reaction conditions, other processes, other evaluation methods or other instruments rather than limiting to the aforementioned examples.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

TABLE 1

| Composition | | | Examples | | | | | | | Comparative Examples | | | | | | |
|---|---|---|---|---|---|---|---|---|---|---|---|---|---|---|---|---|
| | | | 1 | 2 | 3 | 4 | 5 | 6 | 7 | 1 | 2 | 3 | 4 | 5 | 6 | 7 |
| Alkaline-soluble resin (A) (parts by weight) | A-1 | A-1-1 | 100 | | | 70 | | | 80 | | | | | 50 | | |
| | | A-1-2 | | 100 | | | 50 | | | | 100 | | | | | |
| | | A-1-3 | | | 100 | | | 30 | 20 | | | 100 | | | | |
| | A-2 | A-2-1 | | | | 30 | | | | 100 | | | | 100 | 50 | |
| | | A-2-2 | | | | | 50 | 70 | | | | | 100 | | | 100 |
| Compound containing vinyl unsaturated group(s) (B) (parts by weight) | B-1 | | | 60 | | 50 | 20 | 40 | 40 | 60 | | 50 | 40 | | 20 | 80 |
| | B-2 | | | | 30 | 50 | 60 | 100 | 180 | | 30 | 50 | 100 | 180 | | 60 |
| Photo initiator (C) (parts by weight) | C-1 | C-1-1 | 30 | | | 10 | | | 20 | 30 | | | | 20 | | |
| | | C-1-2 | | 25 | | | 10 | | | | | 40 | | | | |
| | | C-1-3 | | | 90 | | | 30 | | | | | | | | |
| | C-2 | C-2-1 | | | | 10 | | 10 | | | 20 | | 30 | | 10 | |
| | | C-2-2 | | | | | 10 | | 25 | | | | | 25 | | 10 |
| Quinonediazido sulfonic acid ester (D) (parts by weight) | D-1 | | 20 | 10 | 30 | | | 3 | | 20 | 10 | | 4 | | | |
| | D-2 | | | | | 20 | | | 40 | | | | | | | |
| | D-3 | | | | | | 20 | | | | | | | | | |
| Solvent (E) (parts by weight) | E-1 | | 2000 | 3000 | | 2000 | 2000 | 1000 | 4000 | 2000 | 3000 | | 1000 | 4000 | 2000 | 2000 |
| | E-2 | | 500 | | 3500 | 1000 | 2000 | | 500 | 500 | | 3500 | | 500 | 1000 | 2000 |
| Black pigment (F) (parts by weight) | F-1 | | 300 | | 300 | | 800 | | 500 | 300 | | 300 | | 450 | | 800 |
| | F-2 | | 100 | 300 | | 100 | | 500 | 500 | 100 | 300 | | 500 | 450 | 100 | |
| Evaluation items | Adhesiveness after being developed | | ○ | ○ | ○ | ○ | ○ | ○ | ○ | X | X | ○ | X | X | X | X |
| | Residue | | ○ | ○ | ○ | ○ | ○ | ○ | ○ | ○ | ○ | X | ○ | X | X | X |

B-1 dipentaerythritol hexaacrylate
B-2 dipentaerythritol tetraacrylate
C-1-1 ethanone, 1-[9-ethyl-6-(2-methylbezoyl)-9H-carbozole-3-yl]-1-(O-acetyl oxime) (the trade name OXE02, manufactured by Ciba Specialty Chemicals Co.)
C-1-2 1-[4-(phenylthio)phenyl]-octane-1,2-dione 2-(O-benzoyloxime) (the trade name OXE01 manufactured by CIBA SPECIALTY CHEMICALS Corporation)
C-1-3 ethanone-1-[9-ethyl-6-(2-methyl-4-tetrahydrofuranlymethoxybenzoyl)-9H-carbazole-3-yl[-1-(O-acetyloxime)
C-2-1 2-benzyl-2-N,N-dimethylamino-1-(4-morpholinophenyl)-1-butanone (the trade name of IRGACURE 369, manufactured by Ciba Specialty Chemicals Corporation)
C-2-2 2-methyl-1-(4-methylthiophenyl)-2-morpholino-1-propanone (the trade name of IRGACURE 907, manufactured by Ciba Specialty Chemicals Corporation)
D-1 ortho-naphthoquinone diazide sulfonic acid ester of 4,4'-[1-[4[-1-(4-hydroxyphenyl)-1-methylethyl]phenyl]ethylidene]bisphenol and ortho-naphthoquinone diazide-5-sulfonic acid
D-2 ortho-naphthoquinone diazide sulfonic acid ester of 2,3,4-trihydroxybenzophenone and ortho-naphthoquinone diazide-5-sulfonic acid
D-3 ortho-naphthoquinone diazide sulfonic acid ester of 2-(2,3,4-trihydroxylphenyl)-2-(2',3',4'-trihydroxylphenyl) propane and ortho-naphthoquinone diazide-5-sulfonic acid
E-1 propylene glycol monomethyl ether acetate
E-2 ethyl 3-ethoxypropanoate
F-1 Trade name MA100 (manufactured by Mitsubishi Chemical Co.)
F-2 Trade name MA230 (manufactured by Mitsubishi Chemical Co.)

What is claimed is:

1. A photosensitive resin composition, comprising:
an alkaline-soluble resin (A), wherein the alkaline-soluble resin (A) comprises a resin having unsaturated group(s) (A-1), the resin having unsaturated groups (A-1) is synthesized by subjecting a mixture to a polymerization, and the mixture comprises an epoxy compound having at least two epoxy groups (i) and a compound having at least a carboxyl group and at least a vinyl unsaturated group (ii);
a compound containing vinyl unsaturated group(s) (B);
a photo initiator (C);
quinonediazide sulfonic acid ester (D) synthesized by an ortho-naphthoquinone diazide sulfonic acid and a hydroxyl compound or a salt of the ortho-naphthoquinone diazide sulfonic acid and the hydroxyl compound, wherein the hydroxyl compound includes a hydroxyl aryl compound having a structure of Formula (III):

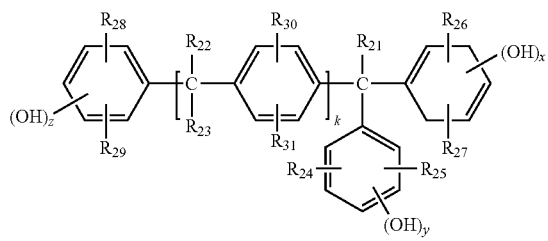

(III)

wherein, $R_{21}$ to $R_{23}$ are the same or different from each other, each of which independently represents a hydrogen atom or a $C_1$ to $C_6$ alkyl group; $R_{24}$-$R_{29}$ are the same or different from each other, each of which independently represents a hydrogen atom, a halogen atom, a $C_1$ to $C_6$ alkyl group, a $C_1$ to $C_6$ alkoxy group, a $C_1$ to $C_6$ alkenyl group and a cycloalkyl group; $R_{30}$ and $R_{31}$ are the same or different from each other, each of which independently represents a hydrogen atom, a halogen atom and a $C_1$ to $C_6$ alkyl group; x, y and z each independently represents an integer of 1 to 3; and k is 0 or 1;

a solvent (E), and a black pigment (F), wherein the photo initiator (C) includes an O-acyloxime compound (C-1).

2. The photosensitive resin composition of claim 1, wherein the epoxy compound having at least two epoxy groups (i) includes a structure having Formula (I) or Formula (II):

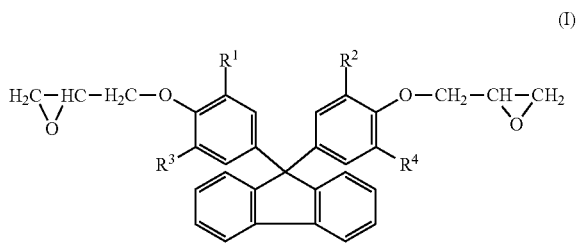

(I)

wherein the $R^1$, the $R^2$, the $R^3$ and the $R^4$ are the same or different from each other, each of which independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms;

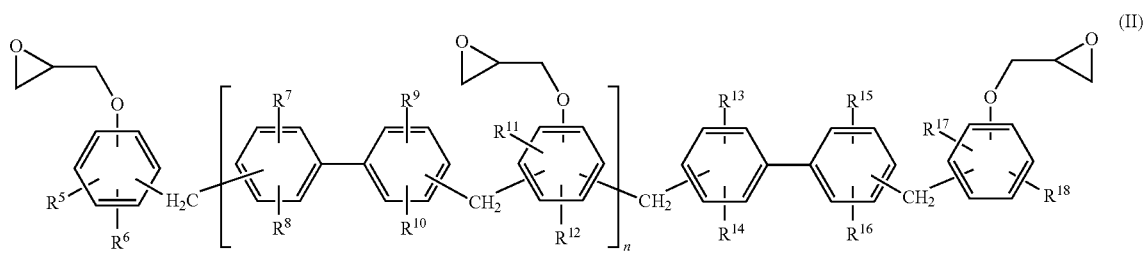

(II)

wherein the $R^5$ to the $R^{18}$ are the same or different from each other, each of which independently represents a hydrogen atom, a halogen atom, an alkyl group with one to eight carbon atoms or an aromatic group with six to fifteen carbon atoms, and the n represents an integer of zero to ten.

3. The photosensitive resin composition of claim 1, wherein the epoxy compound having at least two epoxy groups (i) includes a structure having Formula (I):

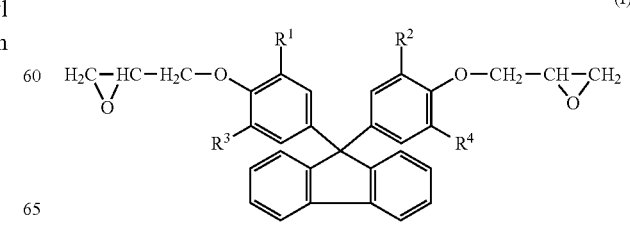

(I)

wherein the $R^1$, the $R^2$, the $R^3$ and the $R^4$ are the same or different from each other, each of which independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms.

4. The photosensitive resin composition of claim 1, wherein the epoxy compound having at least two epoxy groups (i) includes a structure having Formula (II):

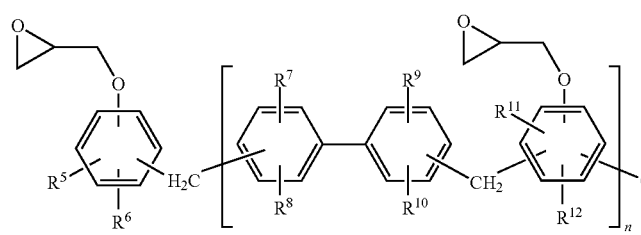

wherein the $R^5$ to the $R^{18}$ are the same or different from each other, each of which independently represents a hydrogen atom, a halogen atom, an alkyl group with one to eight carbon atoms or an aromatic group with six to fifteen carbon atoms, and the n represents an integer of zero to ten.

5. The photosensitive resin composition of claim 1, wherein based on an amount of the alkali-soluble resin (A) as 100 parts by weight, an amount of the resin having unsaturated group(s) (A-1) is 30 to 100 parts by weight, an amount of the compound containing vinyl unsaturated group(s) (B) is 20 to 180 parts by weight, an amount of the quinonediazide sulfonic acid ester (D) is 3 to 40 parts by weight, an amount of the solvent (E) is 500 to 5000 parts by weight, and an amount of the black pigment (F) is 100 to 1,000 parts by weight.

6. The photosensitive resin composition of claim 1, wherein based on an amount of the compound containing vinyl unsaturated group(s) (B) as 100 parts by weight, an amount of the photo initiator (C) is 20 to 100 parts by weight.

7. The photosensitive resin composition of claim 1, wherein based on an amount of the compound containing vinyl unsaturated group(s) (B) as 100 parts by weight, an amount of the O-acyloxime compound (C-1) is 10 to 90 parts by weight.

8. A black matrix formed by a photosensitive resin, wherein the photosensitive resin composition comprises:
an alkaline-soluble resin (A), wherein the alkaline-soluble resin (A) comprises a resin having unsaturated group(s) (A-1), the resin having unsaturated groups (A-1) is synthesized by subjecting a mixture to a polymerization, and the mixture comprises an epoxy compound having at least two epoxy groups (i) and a compound having at least a carboxyl group and at least a vinyl unsaturated group (ii);

a compound containing vinyl unsaturated group(s) (B);

a photo initiator (C);

quinonediazide sulfonic acid ester (D) synthesized by an ortho-naphthoquinone diazide sulfonic acid and a hydroxyl compound or a salt of the ortho-naphthoquinone diazide sulfonic acid and the hydroxyl compound, wherein the hydroxyl compound includes a hydroxyl aryl compound having a structure of Formula (III):

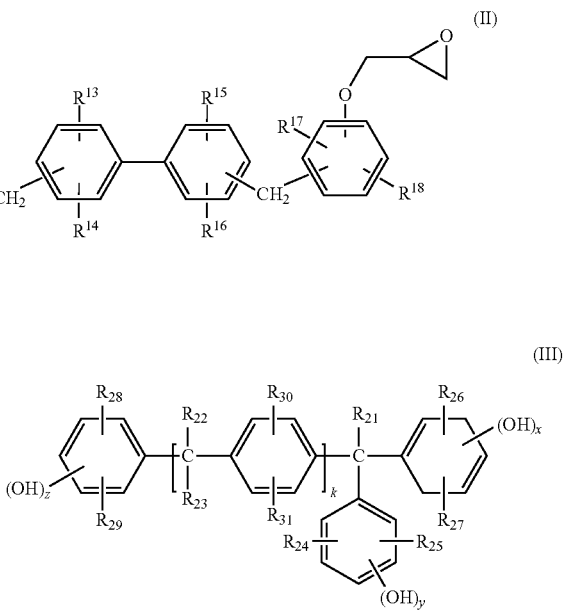

wherein $R_{21}$ to $R_{23}$ are the same or different from each other, each of which independently represents a hydrogen atom or a $C_1$ to $C_6$ alkyl group; $R_{24}$-$R_{29}$ are the same or different from each other, each of which independently represents hydrogen atom, a halogen atom, a $C_1$ to $C_6$ alkyl group, a $C_1$ to $C_6$ alkoxy group, a $C_1$ to $C_6$ alkenyl group and a cycloalkyl group; $R_{30}$ and $R_{31}$ are the same or different from each other, each of which independently represents a hydrogen atom, a halogen atom and a $C_1$ to $C_6$ alkyl group; x, y and z each independently represents an integer of 1 to 3; and k is 0 or 1;

a solvent (E), and a black pigment (F), wherein the photo initiator (C) includes an O-acyloxime compound (C-1).

9. The black matrix of claim 8, wherein the epoxy compound having at least two epoxy groups (i) includes a structure having Formula (I) or Formula (II):

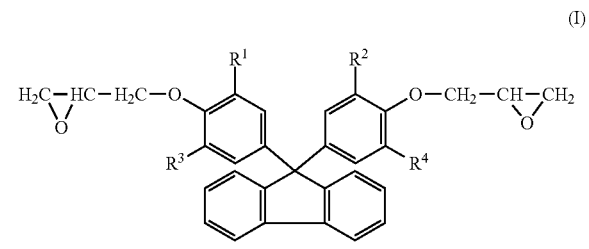

wherein the $R^1$, the $R^2$, the $R^3$ and the $R^4$ are the same or different from each other, each of which independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms;

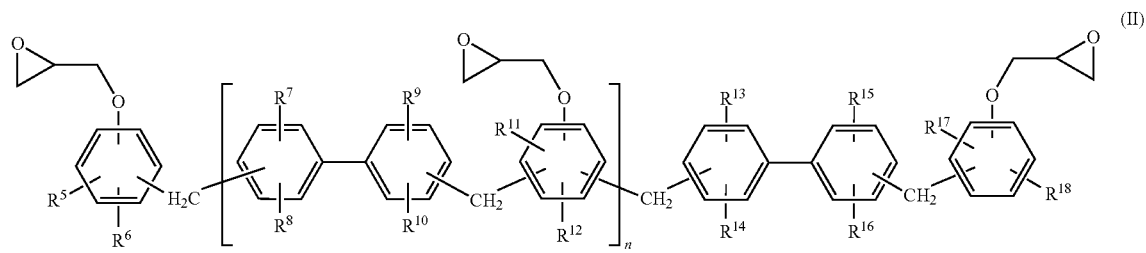

wherein the $R^5$ to the $R^{18}$ are the same or different from each other, each of which independently represents a hydrogen atom, a halogen atom, an alkyl group with one to eight carbon atoms or an aromatic group with six to fifteen carbon atoms, and the n represents an integer of zero to ten.

10. The black matrix of claim 8, wherein the epoxy compound having at least two epoxy groups (i) includes a structure having Formula (I):

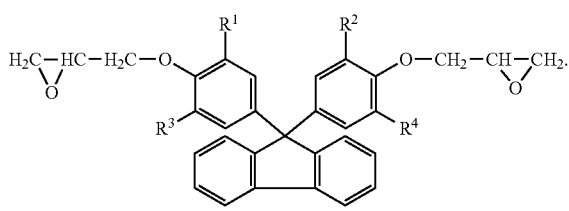

wherein the $R^1$, the $R^2$, the $R^3$ and the $R^4$ are the same or different from each other, each of which independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms.

11. The black matrix of claim 8, wherein the epoxy compound having at least two epoxy groups (i) includes a structure having Formula (II):

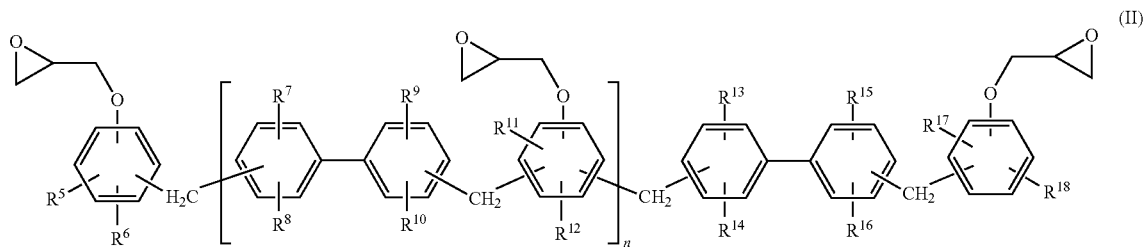

wherein the $R^5$ to the $R^{18}$ are the same or different from each other, each of which independently represents a hydrogen atom, a halogen atom, an alkyl group with one to eight carbon atoms or an aromatic group with six to fifteen carbon atoms, and the n represents an integer of zero to ten.

12. The black matrix of claim 8, wherein based on an amount of the alkali-soluble resin (A) as 100 parts by weight, an amount of the resin having unsaturated group(s) (A-1) is 30 to 100 parts by weight, an amount of the compound containing vinyl unsaturated group(s) (B) is 20 to 180 parts by weight, an amount of the quinonediazido sulfonic acid ester (D) is 3 to 40 parts by weight, an amount of the solvent (E) is 500 to 5000 parts by weight, and an amount of the black pigment (F) is 100 to 1,000 parts by weight.

13. The black matrix of claim 8, wherein based on an amount of the compound containing vinyl unsaturated group(s) (B) as 100 parts by weight, an amount of the photo initiator (C) is 20 to 100 parts by weight.

14. The black matrix of claim 8, wherein based on an amount of the compound containing vinyl unsaturated group(s) (B) as 100 parts by weight, an amount of the O-acyloxime compound (C-1) is 10 to 90 parts by weight.

15. A color filter characterized by including the black matrix of claim 8.

16. A liquid crystal display (LCD) device characterized by including the color filter of claim 15.

* * * * *